(12) United States Patent
Kimata (10) Patent No.: US 8,073,670 B2
(45) Date of Patent: Dec. 6, 2011

(54) METHOD FOR CALCULATING DELAY TIME, PROGRAM FOR CALCULATING DELAY TIME AND DEVICE FOR CALCULATING DELAY TIME

(75) Inventor: Atsushi Kimata, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 11/352,249

(22) Filed: Feb. 13, 2006

(65) Prior Publication Data

US 2006/0152088 A1 Jul. 13, 2006

Related U.S. Application Data

(63) Continuation of application No. PCT/JP03/11365, filed on Sep. 5, 2003.

(51) Int. Cl.
G06F 17/50 (2006.01)

(52) U.S. Cl. ........................................................ 703/19

(58) Field of Classification Search ....................... 703/19
See application file for complete search history.

(56) References Cited

U.S. PATENT DOCUMENTS

| | | | | |
|---|---|---|---|---|
| 5,274,568 | A * | 12/1993 | Blinne et al. | 716/6 |
| 5,600,568 | A * | 2/1997 | Iwakura et al. | 716/6 |
| 6,389,381 | B1 * | 5/2002 | Isoda et al. | 703/19 |
| 6,718,529 | B1 * | 4/2004 | Iwanishi | 716/6 |
| 6,986,115 | B2 * | 1/2006 | Sakano | 716/5 |
| 2004/0060021 | A1 * | 3/2004 | Sakano | 716/6 |
| 2004/0216067 | A1 * | 10/2004 | Tanaka et al. | 716/10 |
| 2005/0190702 | A1 * | 9/2005 | Yamamoto et al. | 370/252 |

FOREIGN PATENT DOCUMENTS

| | | |
|---|---|---|
| JP | 9-311877 | 12/1997 |
| JP | 11-3366 | 1/1999 |
| JP | 2000-40098 | 2/2000 |
| JP | 2000-195960 | 7/2000 |

OTHER PUBLICATIONS

Young-Hyun Jun, Ki Jun, Song-Bai Park, 1989, Computer-Aided Design of Integrated Circuits and Systems, IEEE Transactions, vol. 8, Issue: 9, pp. 1027-1032.*

Masao Inoue, et al., "Delay Parameter Extracting System on Standard Cell", Information Processing Society of Japan, vol. 33, No. 3, pp. 2251-2252, Oct. 23, 1986.

(Continued)

*Primary Examiner* — Hugh Jones
(74) *Attorney, Agent, or Firm* — Staas & Halsey LLP (57) ABSTRACT

A data row of delay time ratio coefficient (hereinafter referred to as DMAG value) is selected from a delay information library (D2) (S4) for every circuit cell in a use condition range of a logic circuit, and the minimum value or/and maximum value of a DMAG value is extracted (S5). The minimum value or/and the maximum delay time is/are calculated for every circuit cell by multiplying the standard delay time to the extracted DMAG value (S6). The above processing is performed for all the circuit cells constituting the logic circuit ((S7): NO), and the data set of the minimum or/and maximum delay time in the use condition range of the logic circuit is/are acquired for every circuit cell (S8). When the delay time characteristic of the circuit cell is nonlinear, the delay time serving as the minimum or/and the maximum for every circuit cell can be freely selected in the range of the circuit use condition unlike the case where the delay time is calculated by uniformly assigning the same use condition to all circuit cells.

12 Claims, 5 Drawing Sheets

OTHER PUBLICATIONS

Toru Toyoda, et al., "A VLSI Delay Library Generation Aid System", Information Processing Society of Japan, vol. 91, No. 58, pp. 1-8, Jul. 12, 1991.

Toru Toyoda, et al., "ASIC Library Generation System", NEC Technical Journal, vol. 47, No. 3, pp. 170-173, Mar. 25, 1994.

Masao Inoue, et al., "Delay Parameter Extracting System on Standard Cell", Information Processing Society of Japan, vol. 33, No. 3, pp. 2251-2252, Oct. 23, 1986.

Toru Toyoda, et al., "ASIC Library Generation System", NEC Technical Journal, vol. 47, No. 3, pp. 170-173, Mar. 25, 1994.

\* cited by examiner

METHOD FOR CALCULATING DELAY TIME, PROGRAM FOR CALCULATING DELAY TIME AND DEVICE FOR CALCULATING DELAY TIME

CROSS-REFERENCE TO RELATED APPLICATIONS

This application is a continuation application based upon and claims the benefit of the prior PCT International Patent Application No. PCT/JP2003/011365 filed on Sep. 5, 2003, the entire contents of which are incorporated herein by reference.

BACKGROUND OF THE INVENTION

1. Field of the Invention

The present invention relates to a method for calculating delay time, program for calculating delay time and device for calculating delay time needed in a circuit design. More particularly, the present invention relates to a method for calculating delay time, program for calculating delay time and device for calculating delay time needed in a circuit design of a semiconductor device miniaturized and highly integrated.

2. Description of the Related Art

Patent Document 1 shown below has been conventionally disclosed. Procedures for calculating delay time in a desired circuit use condition of each circuit element constituting a semiconductor device based on data stored in a coefficient table 150 are shown in the Patent Document 1. Herein, the circuit use condition is the process condition, use temperature and power supply voltage of the semiconductor device.

Figure 5:
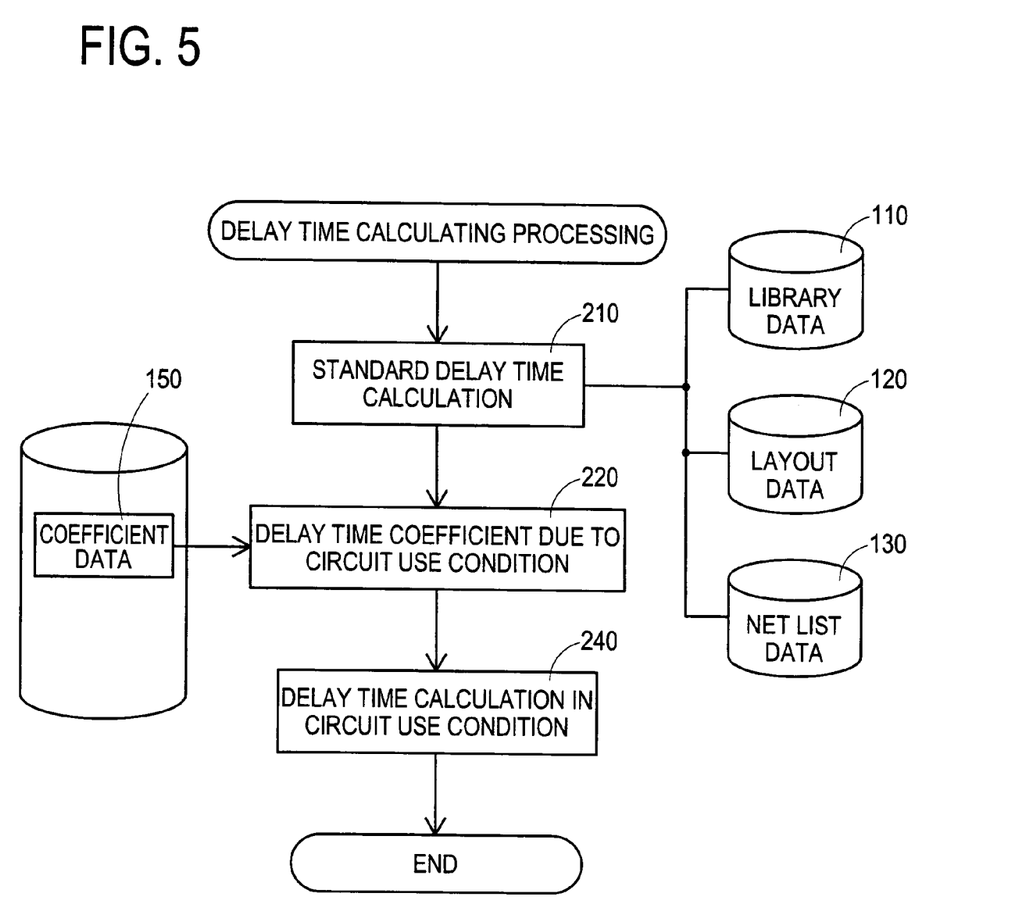
FIG. 5 is a flow chart showing the calculation of delay time in prior art.

In the delay time calculating processing shown in FIG. 5, in step 210, based on various data stored in data files 110 to 130, the standard delay time tpd0 of the semiconductor device in a standard use condition is calculated. In step 220, delay time ratio coefficient DMAG100 in a desired circuit use condition is read out from delay time ratio coefficient table 150, and the delay time tpd is calculated as tpd=tpd0×DMAG100 in step 240.

Herein, the delay time ratio coefficient DMAG100 is a value of the ratio of the standard delay time tpd0 and delay time calculated according to the circuit use condition. A delay time in the circuit use condition is calculated by multiplying the delay time ratio coefficient DMAG100 to the standard delay time tpd0. The delay time is generally expressed as a linear function of a monotone increase to the circuit use condition such as a process condition, a use temperature and a power supply voltage.

The timing verification needs verification in the circuit use condition operating in the minimum delay time and the maximum delay time as a boundary condition, and the delay time ratio coefficient DMAG100 is the linear function of the monotone increase to the circuit use condition. Thereby, the minimum value/maximum value of the delay time ratio coefficient DMAG100 at the time of calculating the minimum/maximum delay time is a value in the condition of both ends in the circuit use condition. That is, the minimum delay time is calculated by delay time ratio coefficient in the fastest process condition, lowest use temperature and the maximum power supply voltage, and the maximum delay time is calculated by delay time ratio coefficient in the latest process condition, maximum use temperature and the minimum power supply voltage. The timing verification is performed based on the delay time ratio coefficient in the condition of both ends in the circuit use condition.

The above prior art reference is as follows.
Patent Document 1: Japanese Published Unexamined Patent Application H11-3366

SUMMARY OF THE INVENTION

However, in the process technology detailed and highly integrated in semiconductor device manufacturing in recent years, the linear function characteristic of the delay time ratio coefficient to the circuit use condition may be collapsed by actualizing the nonlinearity of an element characteristic. For example, the nonlinearity such as variation in the temperature characteristics of the element cannot be disregarded by the progress of the lowering voltage of the power supply voltage, and the delay time may be shortened according to the rise in the use temperature. It is considered that the characteristic of the delay time ratio coefficient to the circuit use condition may be reversed or the delay time ratio coefficient may become the minimum/maximum in the middle condition in the range of the circuit use condition. The premise of the conventional timing verification performed as the delay time ratio coefficient in the condition of both ends in the circuit use condition is the minimum/maximum cannot be applied, and this poses a problem.

It may be necessary to add the middle condition in the circuit use condition as the verification condition. The condition which should be verified is increased, and it poses a problem in that it requires much time for verification.

It is also considered that the condition of the timing verification is uniformly tightened, and incorrect verification is avoided by adding a variation coefficient and further extending the minimum value/maximum value of the delay time ratio coefficient in calculating the delay time. However, the expansion of the delay time ratio coefficient due to the variation coefficient means the requirement of the circuit calculating margin beyond a circuit calculating margin being needed originally, and may be recognized as a timing error in the circuit use condition which is not a timing error from original circuit operation. So as to eliminate the error in this case, a measure such as addition/elimination of the delay is needed for the circuit. It is necessary to previously secure a preliminary element arrangement area for adding a delay element. A preliminary area is also secured in addition to an area in which an element required for original circuit operation is arranged, and is forced to be a circuit configuration acquired by adding a circuit for delay to the circuit configuration originally required. Thereby, it is contrary to the request of high integration.

The present invention has been developed to eliminate at least one problem of the conventional art. It is an object of the present invention to provide a method for calculating delay time, program for calculating delay time and device for calculating delay time capable of calculating the fastest or/and latest condition of a circuit block in a minimum extracting condition, and capable of performing a circuit design which needs no preliminary circuit configuration such as the adjustment of delay time in spite of the difference in the delay time and the characteristic of the delay time ratio coefficient for every circuit cell to the circuit use condition.

A method for calculating delay time according to a first aspect of the invention attempted to achieve the object stated above, comprises the steps of: extracting a minimum delay time or/and a maximum delay time in a range of a predetermined circuit use condition for every circuit cell constituting a circuit block to the circuit block provided with the circuit cell having delay time information for each of a circuit use condition; and selecting the minimum delay time or/and the maximum delay time as a delay time of each of the circuit cell in the fastest condition or/and latest condition of the circuit block in the range of the predetermined circuit use condition.

In the method for calculating delay time of the first aspect of the invention, the minimum delay time or/and the maximum delay time of the circuit cell in the range of the predetermined circuit use condition is/are extracted for every circuit cell constituting the circuit block by the step of extracting the cell delay time. The minimum or/and maximum delay time extracted is/are selected as the delay time of each of the circuit cell in the fastest condition or/and latest condition of the circuit block in the range of the predetermined circuit use condition by the step of selecting the cell delay time.

A method for calculating delay time according to a second aspect comprises the steps of: instead of extracting the cell delay time in the method for calculating delay time of the first aspect, extracting a minimum value or/and a maximum value of a delay time ratio coefficient in a range of a predetermined circuit use condition for every circuit cell constituting a circuit block; and calculating a minimum delay time or/and a maximum delay time of the circuit cell by calculating the minimum value or/and the maximum value of the delay time ratio coefficient and the standard delay time.

In the method for calculating delay time of the second aspect of the invention, the minimum value or/and the maximum value of the delay time ratio coefficient in the range of the predetermined circuit use condition is/are extracted for every circuit cell constituting the circuit block by the step of extracting the cell coefficient. The minimum value or/and the maximum value of the delay time ratio coefficient extracted is/are calculated between the values and the standard delay time by the step of calculating the cell delay time, and the minimum delay time or/and maximum delay time of each of the circuit cell is/are selected.

A program for calculating delay time according to a first aspect, comprises the steps of: extracting a minimum delay time or/and a maximum delay time in a range of a predetermined circuit use condition from a data library for every circuit cell constituting a circuit block, the data library where delay time information for each of a circuit use condition for the circuit cell constituting the circuit block is stored; and selecting the minimum delay time or/and the maximum delay time as a delay time of each of the circuit cell in the fastest condition or/and latest condition of the circuit block in the range of the predetermined circuit use condition.

In the program for calculating delay time of the first aspect of the invention, the step of extracting the cell delay time and the step of selecting the cell delay time are performed based on the data library.

A program for calculating delay time according to a second aspect, comprises the steps of: instead of extracting the cell delay time in the program for calculating the delay time of the first aspect, extracting a minimum value or/and a maximum value of a delay time ratio coefficient in a range of a predetermined circuit use condition from a data library for every circuit cell constituting a circuit block; and calculating a minimum delay time or/and a maximum delay time of the circuit cell by calculating the minimum value or/and the maximum value of the delay time ratio coefficient and the standard delay time.

In the program for calculating delay time of the second aspect of the invention, the step of extracting the cell coefficient, the step of calculating the cell delay time and the step of selecting the cell delay time are performed based on the data library.

A device for calculating delay time, according to a first aspect, provided with a data library part in which a delay time information for each of a circuit use condition for a circuit cell constituting a circuit block is stored, comprises: a cell delay time extracting part for extracting a minimum delay time or/and a maximum delay time in a range of a predetermined circuit use condition from the data library part for every circuit cell constituting the circuit block; and a cell delay time selecting part for selecting the minimum delay time or/and the maximum delay time as a delay time of each of the circuit cell in the fastest condition or/and latest condition of the circuit block in the range of the predetermined circuit use condition.

In the device for calculating delay time of the first aspect of the invention, the cell delay time extracting part extracts the minimum delay time or/and the maximum delay time in the range of the predetermined circuit use condition for every circuit cell based on the delay time information from the data library part. The cell delay time selecting part selects the minimum delay time or/and the maximum delay time as the delay time of each of the circuit cell when calculating the fastest condition or/and latest condition of the circuit block in the range of the predetermined circuit use condition.

A device for calculating delay time according to a second aspect, comprises: instead of the cell delay time extracting part in the device for calculating delay time of the first aspect, a cell coefficient extracting part for extracting a minimum value or/and a maximum value of a delay time ratio coefficient in a range of a predetermined circuit use condition from the data library part for every circuit cell constituting the circuit block; and a cell delay time calculating part for calculating a minimum delay time or/and a maximum delay time of the circuit cell by calculating the minimum value or/and the maximum value of the delay time ratio coefficient and the standard delay time.

In the device for calculating delay time of the second aspect of the invention, the cell coefficient extracting part extracts the minimum value or/and the maximum value of the delay time ratio coefficient in the range of the predetermined circuit use condition for every circuit cell. The cell delay time calculating part calculates the minimum delay time or/and the maximum delay time of each of the circuit cell by calculating the minimum value or/and maximum value of the delay time ratio coefficient and the standard delay time.

Thereby, it is not considered as the minimum or/and maximum delay time of the circuit cell by the delay time in a uniform circuit use condition among the circuit cells as the constitution of one circuit block. Even when the circuit use condition when the minimum or/and maximum delay time is/are extracted for every circuit cell is different for every circuit cell, the minimum value or/and the maximum value in the range of the circuit use condition is/are extracted, and thereby the fastest or/and latest condition can be reliably acquired in the circuit block.

Even when the nonlinearity of the delay time to the circuit use condition in the circuit cell is particularly actualized by the nonlinearity of an element characteristic accompanying the progress of the process technology, the minimum or/and maximum delay time in the circuit cell can be reliably extracted.

When extracting the delay time in the condition of the both ends in the circuit use condition as a general rule, processing in which the middle condition for extracting the delay time further in consideration of the nonlinearity in the delay time of the circuit cell is added, and processing for adding a variation coefficient to the extracted delay time to expand the delay time beyond necessity become unnecessary. Since the present invention can simplify the calculating processing of the delay time, the present invention can correspond to the request of high integration without needing the redundant design of the reservation or the like of the arrangement area of the delay circuit or the like corresponding to the false circuit defect accompanying the expansion of the delay time.

DETAILED DESCRIPTION OF THE PREFERRED EMBODIMENTS

Hereinafter, the embodiment specified for the method for calculating delay time, program for calculating delay time and device for calculating delay time of the present invention will be explained in detail referring to the drawings based on FIG. 1 to FIG. 4.

Figure 1:
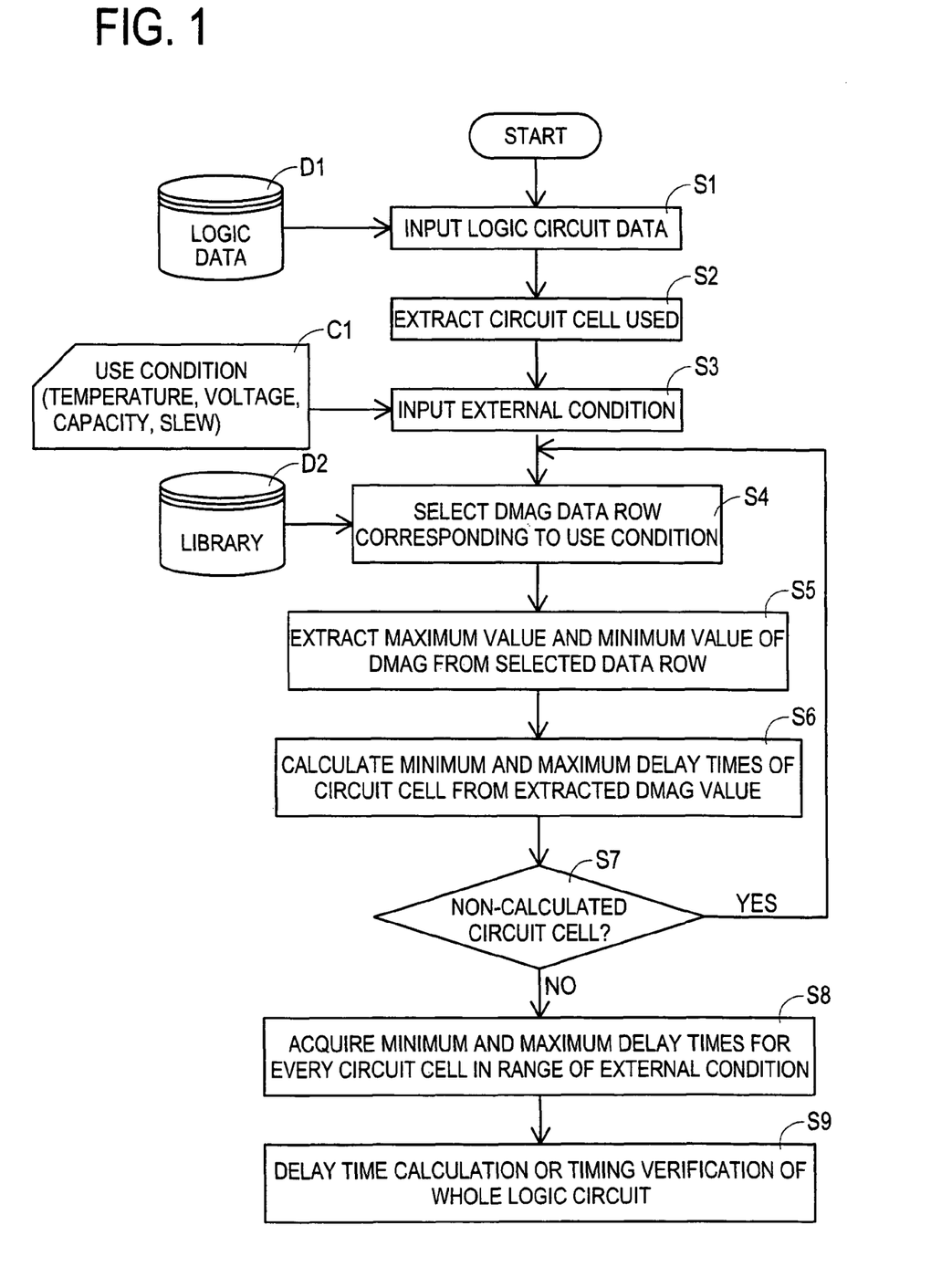
FIG. 1 is a flow chart showing a method for calculating delay time of an embodiment.

In the flow chart of the embodiment according to the method for calculating delay time shown in FIG. 1, delay time information used in a logic simulation, logic synthesis or timing analysis or the like performed in designing a logic circuit is acquired. This processing calculates the minimum value or/and maximum value of the delay time which is/are needed for timing verification of the delay time calculation of signal propagation in a critical pass or the like, the propagation timing of the signal propagating between signal passes or the like for every circuit cell constituting the logic circuit.

First, the data of the logic circuit of an object is inputted from a data storing part (D1) in which data relating to the logic circuit including net list information is stored (S1). Herein, the logic circuit is generally configured on the basis of connecting between the circuit cells by using a basic gate circuit such as a NAND gate as a circuit cell. Net list information showing the input-and-output connection relation between the circuit cells is described in the inputted logic circuit data.

Therefore, so as to acquire the delay time information in the logic circuit, it is necessary to acquire the delay time information for the circuit cell constituting the logic circuit. The circuit cell constituting the logic circuit of an object is extracted as the preparation (S2).

Next, the circuit use condition which should be taken into consideration in the design of the logic circuit is inputted (S3). Herein, the circuit use condition means the condition relating to the operating range which should guarantee the normal operation of the logic circuit, and is a condition having a predetermined width such as the range of the power supply voltage which should be permitted on specification, the range of the use temperature, the variations of the manufacturing process which should be permitted on manufacturing or the like. It is because it is required to acquire the delay time information in the operation range which should guarantee the normal operation of the logic circuit.

In the condition of a manufacturing process, it is possible to input the condition of each manufacturing process directly, and a condition in which each manufacturing process condition is converted into the design factor can also be inputted. In the embodiment, the slew rate of the input signal to the circuit cell and the capacitance load of a signal propagation pass are illustratively inputted as the conversion condition.

Referring to these circuit use conditions, a different range is set according to the specification of the logic circuit of an object, the manufacturing process technology or the verification range capable of being arbitrarily selected by a designer. It is advantageous that the circuit use conditions can be suitably set by a control card or a control file (C1) or the like.

If the circuit cell (S2) constituting the logic circuit, and the use condition (S3) of the logic circuit are decided, the delay time information in the range of the use condition is acquired for every circuit cell by processing of (S4) to (S6).

One circuit cell of the extracted circuit cells is selected, and the data row of the delay time ratio coefficient (hereinafter referred to as DMAG value) in the range of the circuit use condition is selected from the delay information library (D2) (S4).

The minimum value or/and maximum value of the DMAG value is/are extracted from the data row of the selected circuit cell (S5). The extracted DMAG value is acquired by comparing the size of the numerical sequence of the DMAG value selected as the data row, and becomes the minimum value and maximum value in the range of the circuit use condition.

By multiplying the delay time as a standard to the extracted DMAG value, the minimum delay time or/and the maximum delay time in the range of the circuit use condition relating to the selected circuit cell is/are calculated (S6).

If a circuit cell in which the processing of the calculations (S4) to (S6) of the delay time of the circuit cells extracted in (S2) is not performed exists ((S7): YES), the processing of (S4) to (S6) is repeated for a non-calculated circuit cell. When the calculation of the delay time is performed for all the circuit cells constituting the logic circuit ((S7): NO), the data set of the minimum delay time or/and maximum delay time for every circuit cell is acquired for all the circuit cells constituting the logic circuit of the object extracted in (S2) in the range of the circuit use condition inputted by (C1) (S8).

In this case, the circuit use condition in the minimum delay time or/and maximum delay time calculated in each circuit cell can be made arbitrary for every circuit cell. Therefore, when the nonlinearity of the delay time characteristic of the circuit cell to the circuit use condition of the logic circuit is actualized with progress of the process technology in a manufacturing process, unlike the case where delay time is calculated by assigning the same use condition uniformly to all circuit cells, the delay time serving as the minimum or/and maximum for every circuit cell can be freely selected in the range of the circuit use condition.

The data set of the minimum delay time or/and the maximum delay time for every acquired circuit cell is used as delay time information such as calculation and timing verification of the delay time in the logic circuit (S9).

Although, in the embodiment of FIG. 1, the case where the minimum or/and the maximum delay time of the circuit cell is/are calculated by extracting the DMAG value of the circuit cell in (S5) is described and by multiplying between the value and the delay time as a standard in (S6), the present invention is not limited to thereto. When the data row stored in the delay information library (D2) is the delay time according to each circuit use condition in place of the DMAG value, the minimum or/and the maximum delay time in the circuit cell can be further directly extracted by the processing of (S4).

Figure 2:
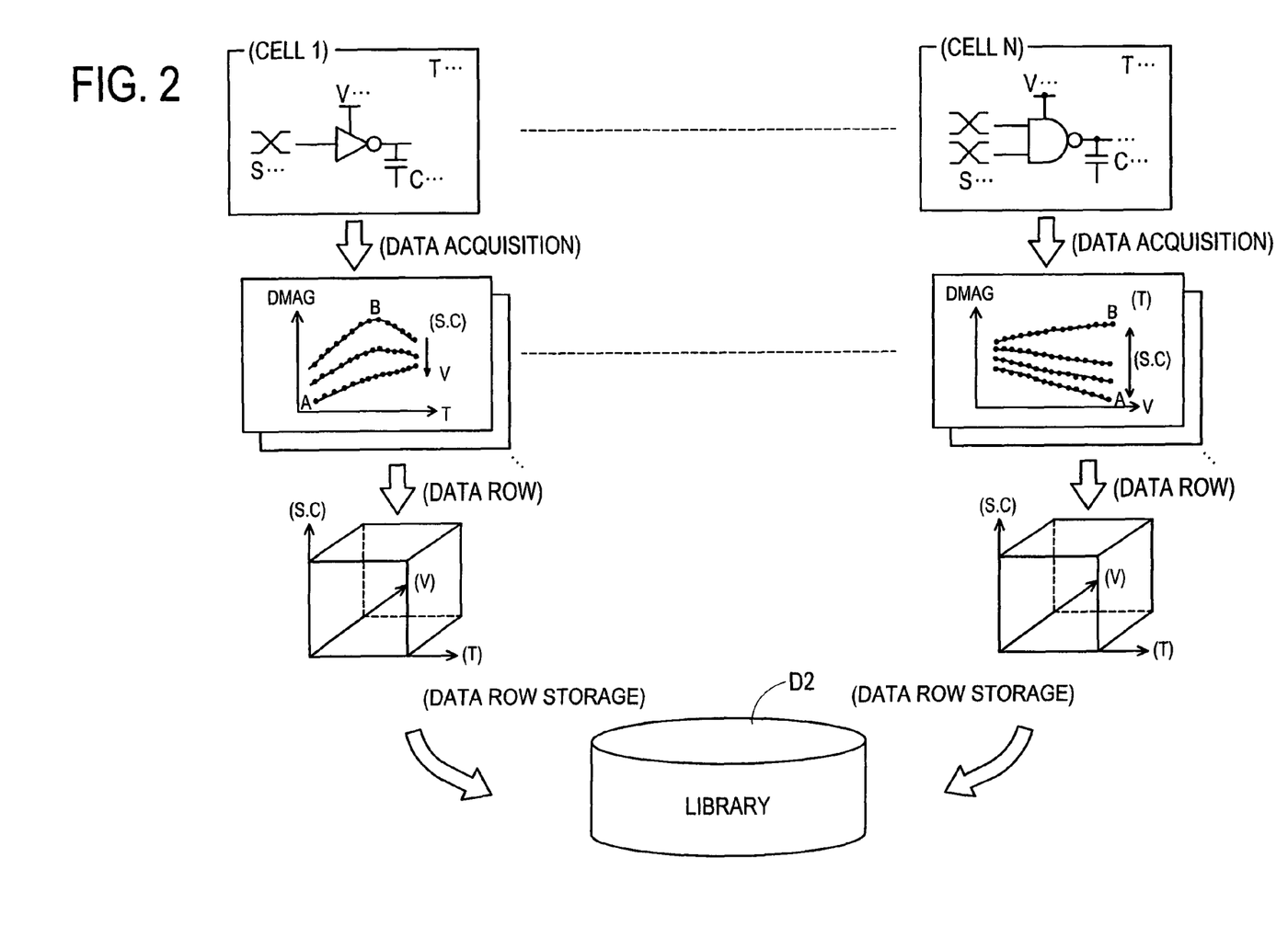
FIG. 2 is a basic concept showing a configuration of a DMAG data library of a circuit cell.

FIG. 2 shows the configuration of a delay information library (D2). The delay time information for every basic gate circuit as the circuit cell constituting the logic circuit is stored in the delay information library (D2). Although the DMAG value is illustratively explained as delay time information in the following explanation, the delay time can also be stored directly in place of the DMAG value. The basic gate circuit is, for example, an inverter gate (cell 1) or is a NAND gate (cell N). It is considered that as the other circuit cells, a basic gate circuit such as an NOR gate and a buffer gate is included and the circuit cell of a functional cell level exhibiting a predetermined circuit function such as a shift register, a level shift circuit, an adder and a multiplier may be further included.

In the delay information library (D2), the DMAG value in each circuit use condition is previously calculated for each of the circuit cells (cell 1) and (cell N). That is, the power supply voltage V, the use temperature T, the slew rate S of the input signal and the load capacitance C of the signal pass as the circuit use condition are used as a parameter, and the data of the DMAG value for each of the circuit cells (cell 1) and (cell N) is acquired for every proper combination of the parameter (V, T, S, C) of each circuit use condition. The data to be acquired does not become the linear function of a simple increase to the circuit use condition necessarily, and is changed by the nonlinearity of a constituent element or the like such as the characteristic (the case of the cell 1) having a peak in a middle condition, and the characteristic (the case of the cell N) in which the inclination of a linear function is reversed, and the circuit configuration for every circuit cell or the like.

Then, even when the nonlinear delay time characteristic is shown depending on the circuit use condition, and it is unknown that the minimum and maximum of the DMAG value in any condition are shown, the DMAG value is preferably calculated every parameter (V, T, S, C) of a prescribed interval so that the minimum value and the maximum value can be reliably extracted. If the prescribed interval of a fine parameter step is set within a tolerance level such as a hardware resource, a software resource and an extraction time for the extraction of the DMAG value, the DMAG value between the steps is not greatly different from the extracted DMAG value.

In addition, when the minimum value and maximum value of the DMAG value are extracted in (S5) of FIG. 1, it is not necessary to calculate the DMAG value between the parameter steps by performing the interpolating operation, and the minimum value and maximum value of the DMAG value can be extracted by a simple processing in which the extracted DMAG value is mutually compared.

The acquired DMAG value is extracted for three kinds (or four kinds if parameter S and parameter C are separated) of parameter conditions, power supply voltage V, the use temperature T, and the manufacturing process origination factors S and C, and is acquired as a data row developed in third dimension (or fourth dimension) coordinates. The delay information library (D2) is configured by storing this data row for every circuit cell.

Herein, when the step of the parameter (V, T, S, C) for extracting the DMAG value becomes fine, or/and when the number of the parameters for extracting the DMAG value increases, it is considered that the load of processing required for extraction of the DMAG value increases. However, the data row of the circuit cell stored in the delay information library (D2) is uniquely determined to the circuit specification and manufacturing process technology of the logic circuit. Once the data row is calculated for every specification or process technology, whenever the circuit cell is added, it is only necessary to extract once. The processing of the interpolation calculating or the like of the DMAG value becoming the minimum and the maximum becomes unnecessary for every delay calculating processing shown in FIG. 1. The overhead of the processing load when extracting the data row of the DMAG value stored in the delay information library (D2) can be disregarded in the delay calculating processing.

Figure 3:
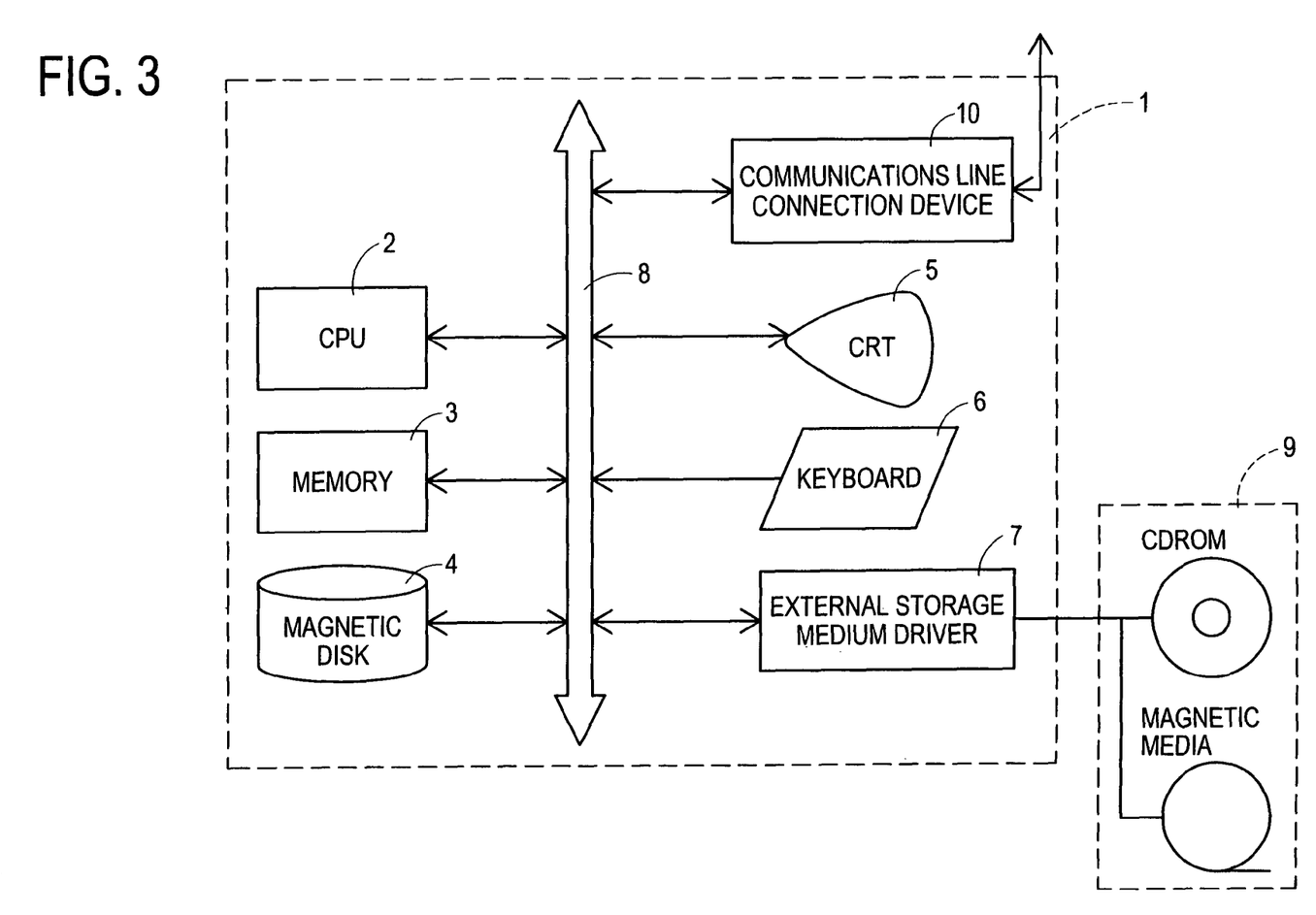
FIG. 3 is a system chart showing a device for calculating delay time of the embodiment.

As for the delay time calculating device 1 shown in FIG. 3, a memory 3, a magnetic disk device 4, a display (hereinafter abbreviated to CRT) 5, a keyboard 6, an external storage medium driver 7 and a communications line connection device 10 are connected via a bus 8 focusing on a central processor (hereinafter abbreviated to CPU) 2. An external storage medium 9 such as a CDROM and a magnetic media are attachably and detachably set in the external storage medium driver 7. The communications line connection device 10 takes an interface with an external communications line such as the Internet.

The delay time calculating program for performing the flow of the method for calculating delay time shown in FIG. 1 is stored in the memory 3 and the magnetic disk driver 4 in the delay time calculating device 1. In addition, the delay time calculating program is supplied via the external storage medium driver 7 when stored in the external storage medium 9 such as the CDROM and the magnetic media, and is supplied via the communications line connection device 10 from the communications line such as the Internet. The supplied program is recorded in the memory 3 or the magnetic disk drive 4 via a bus 8, or is transmitted directly to the CPU 2.

The data storing part (D1) in which logic circuit data including net list information is stored and the delay information library (D2) where the DMAG value is stored for every circuit cell are stored in the storage medium of external storage medium 9 or the like such as the magnetic disk driver 4, the CDROM and the magnetic media. The delay information library may be stored in the same storage medium connected if needed via the communications line.

According to the flow of the method for calculating delay time shown in FIG. 1, the logic circuit data is loaded via a bus 8 or the communications line if needed from the storage medium by the instruction from CPU 2 due to the delay time calculating program (S1).

The loaded data is held in the storage medium such as the memory 3 or magnetic disk drive 4 if needed besides the holding of the CPU 2 itself. Hereinafter, the data extracted and calculated in the process of processing of the program is also the same. In CPU 2, the circuit cell used is extracted based on the inputted logic circuit data (S2). The use condition of the logic circuit is inputted from a keyboard 6 or the external storage medium 9 and the communications line (S3). The use condition can also be previously stored in the memory 3 or magnetic disk device 4.

In (S4) to (S6), the circuit cell constituting the logic circuit from the storage medium is selected, and the minimum value or/and the maximum value in the DMAG data for every circuit cell is/are extracted. The same processing is repeated for all circuit cells (S7), and the data set acquired is stored in the memory 3, the magnetic disk drive 4, the external storage medium 9 and the storage medium of the remote area via the communications line according to the circumstances (S8).

Figure 4:
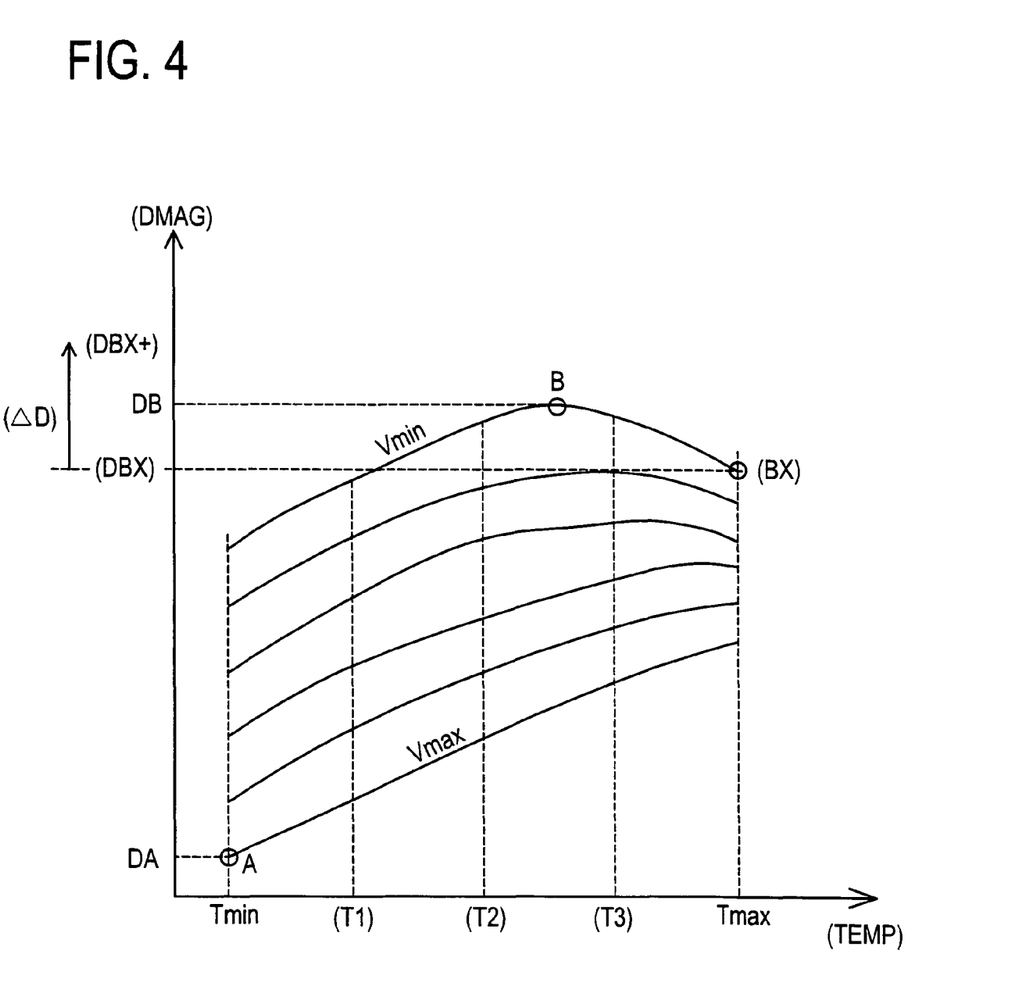
FIG. 4 is a diagram showing a DMAG characteristic including the nonlinear characteristic.

FIG. 4 illustrates the DMAG value characteristic including the nonlinear characteristic. FIG. 4 illustrates the case where the DMAG value characteristic having the peak value to the middle use temperature is shown as power supply voltage reduces.

When the delay time characteristic is linear to the circuit use condition, the condition is uniformly applied to all circuit cells by using the use condition of both ends as the fastest condition and the latest condition in the logic circuit, and the minimum and maximum delay times of the circuit cell are calculated. For example, the lower use temperature Tmin is set to the fastest condition, and the maximum use temperature Tmax is set to the latest condition.

However, as shown in FIG. 4, although the minimum DMAG value DA is calculated at the point A of the minimum temperature Tmin in the case of having the DMAG value characteristic showing nonlinearity, if the DMAG value is calculated at temperatures Tmin and Tmax, the DMAG value DBX at the point BX of the highest temperature Tmax does not become maximum.

So as to correspond to the failure of the acquisition of the above maximum value, variation coefficient AD needs to be added to the DMAG value DBX acquired as the maximum value, and DMAG value DBX+ needs to be made into the maximum value. The delay time beyond the merit value must be set in the logic circuit, and is restrained in the logic circuit design. Another method includes the calculation of the delay time even in the middle use temperatures T1, T2 and T3 in addition to the use temperatures Tmin and Tmax of the both ends for calculating the delay time. This requires much time for the calculation of the delay time.

In this embodiment, the DMAG value is calculated for every predetermined step for every circuit cell by using the circuit use condition for determining the DMAG value as a parameter, and the minimum value and the maximum value can be extracted therefrom. Thereby, the minimum DMAG value DA and the maximum DMAG value DB can be reliably extracted even in the case of having the nonlinear DMAG value characteristic shown in FIG. 4.

Since the minimum or/and the maximum delay time in the range of the circuit use condition is extracted for every basic gate circuit constituting the logic circuit according to the method for calculating the delay time, program for calculating the delay time and device for calculating the delay time of the embodiment as described above in detail, the fastest or/and the latest condition can be reliably calculated in the logic circuit.

Particularly, even when the nonlinearity of the delay time to the circuit use condition in the basic gate circuit is actualized by the nonlinearity of the element characteristic accompanying the progress of the process technology, the minimum or/and the maximum delay time in the basic gate circuit can be reliably extracted.

When extracting the delay time in the condition of both ends in the circuit use condition such as the use temperature as a general rule, processing in which the middle use temperature for extracting the delay time further in consideration of the nonlinearity in the delay time of the circuit cell is added, and processing for adding a variation coefficient to the extracted delay time to expand the delay time beyond necessity become unnecessary. Since the present invention can simplify the calculating processing of the delay time and the redundant design such as the reservation of a preliminary circuit area corresponding to the false circuit fault accompanying the expansion of the delay time is also unnecessary, and the present invention can also respond to the request of high integration.

Herein, the logic circuit is the example of the circuit block and the basic gate circuit is the example of the circuit cell.

The present invention is not limited to the above-described embodiment, and it is a matter of course that various modifications and applications can be performed without departing from the spirit and scope of the invention.

For example, although the logic circuit as the circuit block is explained as the example in this embodiment, the present invention is not limited thereto, and the present invention can be similarly applied to the circuit of analog digital mixed loading containing a logic macro and the other circuit needing delay time information in the circuit design such as the memory circuit.

As can be clearly understood from the foregoing description, according to the present invention, the method for calculating delay time, the program for calculating delay time, and the device for calculating delay time capable of calculating the characteristic of the delay time and delay time ratio coefficient in the necessary minimum extracting condition in the range of the circuit use condition for every circuit cell when the fastest condition or latest condition of the circuit block is calculated, and capable of performing the circuit design by the necessary minimum circuit configuration without securing the preliminary delay circuit area for loading the delay time can be provided.

What is claimed is:

1. A method for calculating a delay time by a computer system, comprising:
    acquiring, from a data library stored in a memory, a data set which is a collection of time information corresponding to a fragmentary parameter set, which is a combination of parameters that have delay time characteristics in each circuit use condition, and put together for each of a plurality of circuit cells constituting a circuit block, each circuit use condition specifying an operation range of the circuit block;
    extracting either one of a minimum delay time or a maximum delay time from the data set acquired for each of the circuit cells;
    calculating a minimum block delay time of the circuit block by summing up the minimum delay time extracted for each of the circuit cells by the extracting or a maximum block delay time of the circuit block by summing up the maximum delay time extracted for each of the circuit cells by the extracting; and
    designing the circuit block in accordance with the calculated circuit block delay time.

2. The method for calculating delay time according to claim 1, wherein the circuit use condition includes one or more of a use temperature, power supply voltage or a process condition at a time of manufacturing of the circuit block.

3. A method for calculating delay time by a computer system, comprising:
    acquiring, from a data library stored in a memory, a data set which is a collection of delay time ratio coefficient corresponding to a fragmentary parameter set, which is a combination of parameters that have delay time characteristics in each circuit use condition, and put together for each of a plurality of circuit cells constituting a circuit block, each circuit use condition specifying an operation range of the circuit block;
    extracting either one of a minimum value or a maximum value of a delay time ratio coefficient from the data set acquired for each of the circuit cells;
    calculating either one of a minimum delay time or a maximum delay time of each of the circuit cells by calculating either one of the minimum value or the maximum value of the delay time ratio coefficient and the standard delay time;
    calculating a minimum block delay time of the circuit block by summing up the minimum delay time of each of the circuit cells calculated by the calculating or a maximum block delay time of the circuit block by summing up the maximum delay time of each of the circuit cells calculated by the calculating; and
    designing the circuit block in accordance with the calculated circuit block delay time.

4. The method for calculating delay time according to claim 3, wherein the circuit use condition includes any one of a use temperature, power supply voltage and process condition at the time of manufacturing of the circuit block.

5. The method for calculating delay time according to claim 2, wherein the process condition at the time of the manufacturing includes any one of a slew rate of an input signal to the circuit cell and the capacitance load of a signal propagation pass.

6. The method for calculating delay time according to claim 4, wherein the process condition at the time of the manufacturing includes any one of a slew rate of an input signal to the circuit cell and the capacitance load of a signal propagation pass.

7. A computer-readable medium including a computer program causing a computer to calculate delay time, comprising:
   acquiring, from a data library stored in a memory, a data set which is a collection of delay time information corresponding to a fragmentary parameter set, which is a combination of parameters that have delay time characteristics in each circuit use condition, and put together for each of a plurality of circuit cells constituting a circuit block, each circuit use condition specifying an operation range of the circuit block;
   extracting either one of a minimum delay time or a maximum delay time from the data set acquired for each of the circuit cells;
   calculating a minimum block delay time of the circuit block by summing up the minimum delay time extracted for each of the circuit cells by the extracting or a maximum block delay time of the circuit block by summing up the maximum delay time extracted for each of the circuit cells by the extracting; and
   designing the circuit block in accordance with the calculated circuit block delay time.

8. A computer-readable medium including a computer program causing a computer to calculate delay time, comprising:
   acquiring, from a data library stored in a memory, a data set which is a collection of delay time ratio coefficient corresponding to a fragmentary parameter set, which is a combination of parameters that have delay time characteristics in each circuit use condition, and put together for each of a plurality of circuit cells constituting a circuit block, each circuit use condition specifying an operation range of the circuit block;
   extracting either one of a minimum value or a maximum value of a delay time ratio coefficient from the data set acquired for each of the circuit cells;
   calculating either one of a minimum delay time or a maximum delay time of each of the circuit cells by calculating either one of the minimum value or the maximum value of the delay time ratio coefficient and the standard delay time;
   calculating a minimum block delay time of the circuit block by summing up the minimum delay time of each of the circuit cells calculated by the calculating or a maximum block delay time of the circuit block by summing up the maximum delay time of each of the circuit cells calculated by the calculating; and
   designing the circuit block in accordance with the calculated circuit block delay time.

9. A device for calculating delay time, comprising a processor that executes:
   acquiring, from a data library stored in a memory, a data set which is a collection of delay time information corresponding to a fragmentary parameter set, which is a combination of parameters that have delay time characteristics in each circuit use condition, and put together for each of a plurality of circuit cells constituting a circuit block, each circuit use condition specifying an operation range of the circuit block;
   extracting either one of a minimum delay time or a maximum delay value from the data set acquired for each of the circuit cells;
   calculating a minimum block delay time of the circuit block by summing up the minimum delay time extracted for each of the circuit cells by the extracting or a maximum block delay time of the circuit block by summing up the maximum delay time extracted for each of the circuit cells by the extracting; and
   designing the circuit block in accordance with the calculated circuit block delay time.

10. A device for calculating delay time, comprising a processor that executes:
    acquiring, from a data library stored in a memory, a data set which is a collection of delay time ratio coefficient corresponding to a fragmentary parameter set, which is a combination of parameters that have delay time characteristics in each circuit use condition, and put together for each of a plurality of circuit cells constituting a circuit block, each circuit use condition specifying an operation range of the circuit block;
    extracting either one of a minimum value or a maximum value of a delay time ratio coefficient from the data set acquired for each of the circuit cells;
    calculating either one of a minimum delay time or a maximum delay time of each of the circuit cells by calculating either one of the minimum value or the maximum value of the delay time ratio coefficient and the standard delay time;
    calculating a minimum block delay time of the circuit block by summing up the minimum delay time of each of the circuit cells calculated by the calculating or a maximum block delay time of the circuit block by summing up the maximum delay time of each of the circuit cells calculated by the calculating; and
    designing the circuit block in accordance with the calculated circuit block delay time.

11. A method for calculating delay time of a circuit block having a plurality of circuit cells by a computer system, comprising:
    selecting a minimum delay time or a maximum delay time for each of the plurality of circuit cell constituting the circuit block, from among a fragmentary parameter set, which is a combination of parameters that have delay time characteristics in a circuit use condition specifying an operation range of the circuit block, and put together for each circuit cell;
    calculating a circuit block delay time of the circuit block by summing up each of the delay times; and
    designing the circuit block in accordance with the calculated circuit block delay time.

12. A method for calculating delay time of a circuit block having a plurality of circuit cells by a computer system, comprising:
    calculating a circuit block delay time responsive to a summation of each delay time freely selected from a minimum delay time and/or a maximum delay time for each of the plurality of circuit cells of the circuit block, from among a fragmentary parameter set, which is a combination of parameters that have delay time characteristics in each circuit use condition specifying an operation range of the circuit block, and put together for each circuit cell, in a range of a circuit use condition; and
    designing a circuit block responsive to the calculated circuit block delay time.

* * * * *